United States Patent [19]

Yukawa

[11] Patent Number: 4,602,167
[45] Date of Patent: Jul. 22, 1986

[54] VOLTAGE COMPARATOR CIRCUIT

[75] Inventor: Akira Yukawa, Tokyo, Japan

[73] Assignee: NEC Corporation, Tokyo, Japan

[21] Appl. No.: 555,730

[22] Filed: Nov. 28, 1983

[30] Foreign Application Priority Data

Nov. 26, 1982 [JP] Japan ................................ 57-207004
Nov. 26, 1982 [JP] Japan ................................ 57-207005

[51] Int. Cl.$^4$ .............................................. H03K 5/24
[52] U.S. Cl. .................................... 307/355; 307/279
[58] Field of Search ............. 307/350, 355, 356, 364, 307/272 A, 279, 288

[56] References Cited

U.S. PATENT DOCUMENTS 4,169,233 9/1979 Haraszti .............................. 307/355
4,274,013 6/1981 Clemons et al. ..................... 307/530
4,485,317 11/1984 Davies, Jr. ......................... 307/530

Primary Examiner—John Zazworsky
Attorney, Agent, or Firm—Sughrue, Mion, Zinn, Macpeak, and Seas

[57] ABSTRACT

A voltage comparator which is hardly affected by noise and is operable with a low power consumption is disclosed. The comparator circuit comprises first and second flip-flop circuits coupled in series between different voltage terminals. The first flip-flop circuit operates in response to a pair of differential voltages and a state of the second flip-flop is determined by the first flip-flop circuit.

11 Claims, 6 Drawing Figures

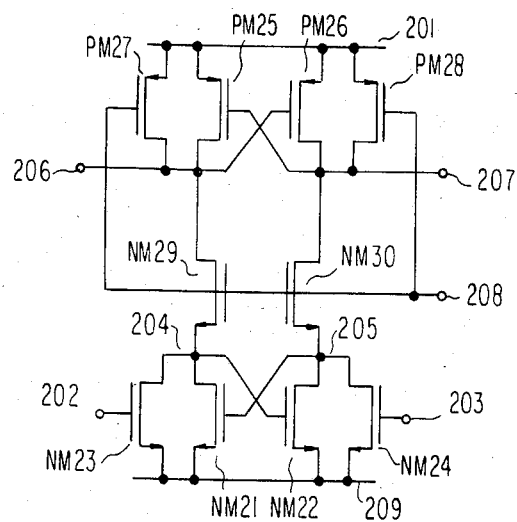
FIG. 4
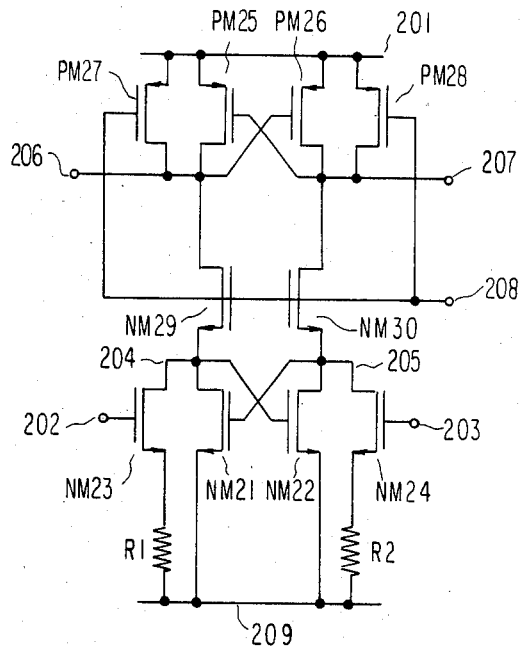
FIG. 6
FIG. 5
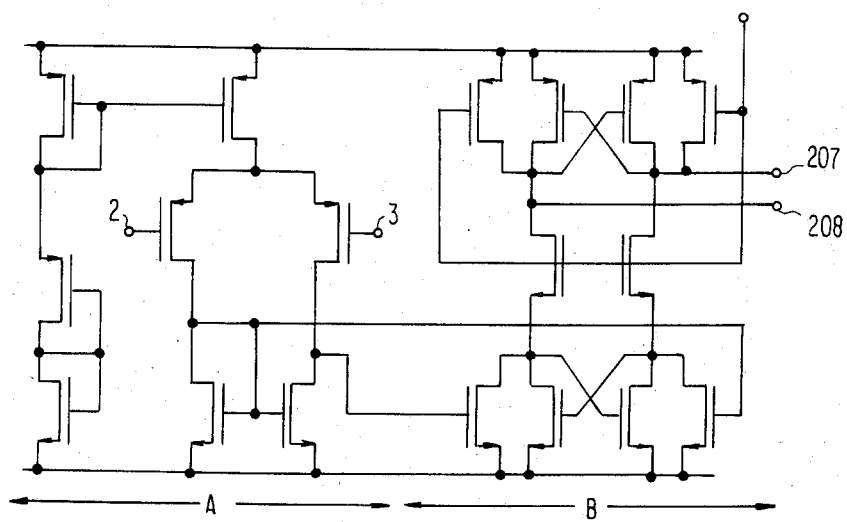

VOLTAGE COMPARATOR CIRCUIT

BACKGROUND OF THE INVENTION

1. Field of the Invention:

The present invention relates to a voltage comparator circuit comprised of complementary insulated-gate field effect transistors (CMOST's), and more particularly, to a voltage comparator integrated circuit which is suited for comparing two voltages having a small difference.

2. Prior Art:

A prior art voltage comparator circuit comprised of CMOST's in the form of an integrated circuit essentially contains a differential amplifier receiving two voltages to be compared and subsequent stages of amplifier circuits amplifying the output of the differential amplifier to obtain a comparison output with a predetermined voltage level.

In the prior art voltage comparator circuit, however, the amplification stages must be increased for obtaining a large amplification factor where the input voltage level is small. It results in an increase in the occupying area in the integrated circuit chip and an increase in an amount of the electric power consumption. Furthermore, there is no assurance that the differential amplifier of the initial stage removes the in-phase voltage component. That is, as the in-phase component in the input voltage signals changes, the output voltage produced by the differential amplifier circuit undergoes the change which is then amplified through amplifiers of the subsequent stages. When the voltage difference of smaller than 1 mV is input, the state of logic "1" and the state of logic "0" may often be erroneously inverted by each other in the output produced by the final stage, depending upon the inphase voltage component. The same phenomenon also takes place when the power supply voltage changes. When the inphase voltage component greatly changes in the input voltage signals, or when the power supply contains much noise, the prior art voltages comparator circuit is no more caoable of comparing the input voltages having a voltage difference smaller than 1 mV. Further, what is most important is that it is very difficult to make the central potential point of the operating voltage of the differential amplifier into coincidence with the central potential point of the operating voltage of the amplifier of the subsequent stage. With the conventional technique, these central potential points deviate by several hundred millivolts and cause an input offset voltage of about 10 mV. It has been impossible to control this offset voltage by the conventional technique. The input voltage signals therefore are compared with the offset voltage contained therein, and hence accurate comparison of the input voltage signals cannot be achieved.

Another technique of comparing voltages is proposed by Andrew G. F. Dingwall in International Solid-State Circuit Conference 79 (1979, ISSCC, Digest of Technical Papers, pp. 126). This circuit, however, has a defect in that it is very susceptible to a power supply noise.

SUMMARY OF THE INVENTION

An object of the present invention is to provide a voltage comparator circuit which has a very high sensitivity and which is not affected by noise.

Another object of the present invention is to provide a voltage comparator circuit which can be fabricated by a reduced number of elements, and whch can be advantageously constructed in the form of an integrated circuit.

The present invention is featured in that a first flip-flop and a second flip-flop are connected in series across the power supply with a pair of differential voltage signals being applied to the first flip-flop, and the state of the second flip-flop is determined by the state of the first flip-flop and taken out as a comparison output.

In the above featured present invention, the output of the first flip-flop is differentially amplified by the second flip-flop, and hence it is possible to compare the voltages with a high sensitivity without being affected by noise. Further, since the first and second flip-flops are connected in series across the power supply, there is formed no DC current path, and the circuit can be operated with a reduced amount of electric power.

According to one aspect of the present invention, there is provided a voltage comparator circuit comprising a first flip-flop which consists of a pair of cross-coupled first and second field effect transistors of a first conductivity type; a third field effect transistor of the first conductivity type and connected in parallel with the first transistor; a fourth field effect transistor of the first conductivity type and connected in parallel with the second transistor; a second flip-flop which consists of a pair of cross-coupled fifth and sixth field effect transistors of a second conductivity; a seventh field effect transistor of the second conductivity type and connected in parallel with the fifth transistor; an eighth field effect transistor of the second conductivity type and connected in parallel with the sixth transistor; a ninth field effect transistor of the first conductivity type and connected in series between the third and seventh transistors; a tenth field effect transistor of the first conductivity type and connected in series between the fourth and eighth transistors; and means for generating pulses; wherein gate electrodes of the seventh, eighth, ninth and tenth transistors are supplied with the pulses and gate electrodes of the third and fourth transistors are supplied with a pair of differential voltage signals, a pair of output signals being taken out from the junction point of the seventh and the ninth transistors and that of the eighth and tenth transistors.

BRIEF DESCRIPTION OF THE DRAWINGS

FIG. 4 is a circuit diagram showing a comparator according to a first embodiment of the present invention;

FIG. 5 is a circuit diagram in which a differential amplifier is combined with the first embodiment of the present invention to enlarge the input voltage range; and FIG. 6 is a circuit diagram showing a comparator according to a second embodiment of the present invention.

Figure 2:
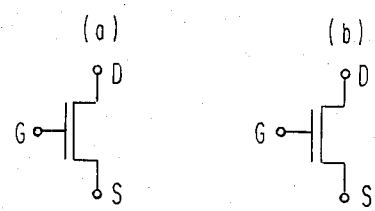
FIG. 2 is a diagram illustrating circuit symbols of transistors employed in the prior art and in the present invention, in which the diagram (a) illustrates the symbols of an N-channel transistor and the diagram (b) illustrates the symbols of a P-channel transistor.

Symbols employed throughout the description are defined as illustrated in FIG. 2(a) which represents an N-channel transistor and in FIG. 2(b) which represents a P-channel transistor. A symbol G denotes a gate, S a source, and D a drain.

DESCRIPTION OF THE PRIOR ART

Figure 1:
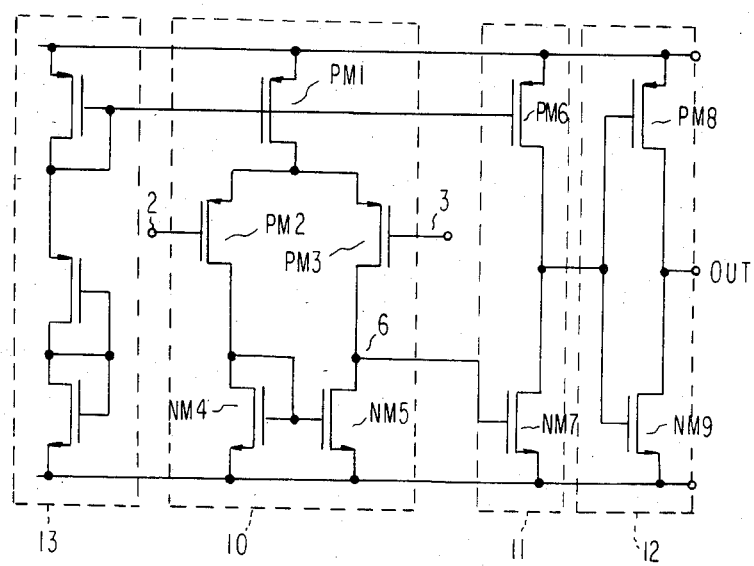
FIG. 1 is a diagram showing a prior art voltage comparator circuit.

A prior art voltage comparator circuit will be described below with reference to FIG. 1.

A differential amplifier 10 consists of a P-channel field effect transistor (PMOST) PM 1 as a current source, PMOST's PM2 and PM3 as input transistors, and N-channel field effect transistors (NMOST's) NM4 and NM5 as current mirror-type loads, and produces from a terminal 6 an output voltage that is proportional to the difference of voltages applied to input terminals 2 and 3. The output voltage is then amplified through amplifier circuits of two stages, i.e., through an inverted amplifier 11 which employs a PMOST PM6 as a constant-current load and an amplifier circuit 12 consisting of a PMOST PM8 and an NMOST NM9.

An amplification factor (gain) of 2000 to 5000 is obtained through the amplifier 11. To obtain further gain, however, the inverted amplifier 12 consisting of MOST's PM8 and NM9 is usually added. A bias voltage-supplying circuit 13 generates a voltage for operating the MOST's PM1 and PM6 in a constant-current region.

With such a voltage comparator circuit, however, the number of amplification stages must be increased when the input voltage decreases, which results in the increase in areas occupying in the integrated circuit and increase in the consumption of electric power. Furthermore, there is no assurance that the differential amplifier 10 of the initial stage reliably removes in-phase voltage component. That is, if the in-phase component changes in the input voltage signals, the output voltage changes at the terminal 6 and is then amplified through the inverted amplifier. When the voltage difference of smaller than 1 mV is input, the state of logic "1" and the state of logic "0" is often erroneously inverted by one another in the output of the final stage, depending upon the in-phase voltage component. The same phenomenon also takes place when the power supply voltage changes. When the in-phase voltage component greatly changes in the input voltage signals, or when the power supply contains much noise, therefore, the above-mentioned voltage comparator circuit is no more capable of comparing voltages smaller than 1 mV. Further, what is most important is that it is very difficult to make the central point of operating voltage of the differential amplifier 10 into coincidence with the central point of operating voltage of the inverted amplifier 11. With the conventional technique, these centers deviate by several hundred millivolts which causes an input offset voltage of about 10 mV. It is not possible to control this offset voltage with the conventional technique. The voltages therefore are compared with the offset voltage being contained therein; i.e., an accurate comparison output can not be obtained.

Figure 3:
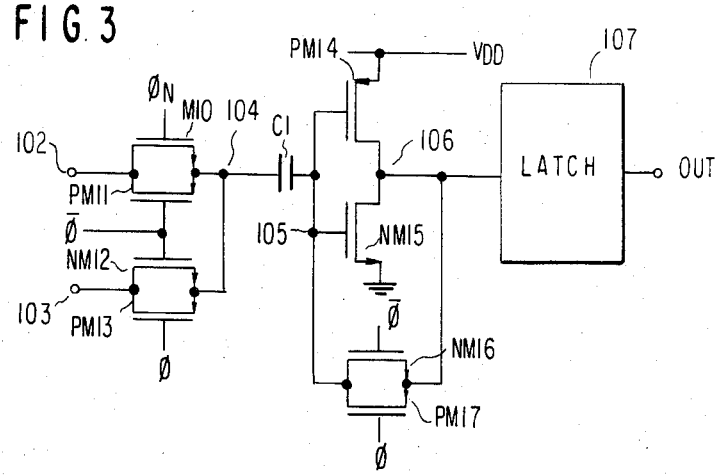
FIG. 3 is a circuit diagram of a comparator according to another prior art.

FIG. 3 shows a voltage comparator circuit which is proposed in the literature (1979, ISSCC, Digest of Technical Papers, pp. 126) mentioned earlier. In this circuit, a pair input voltages introduced through input terminals 102 and 103 are sent to the electrode on one side of a capacitor C1 via switches, one of which is made of an NMOST NM10 and a PMOST PM11, and the other of which is made of an NMOST NM12 and a PMOST PM13, and which are rendered conductive alternately. Another electrode of the capacitor C1 is connected to an input terminal of an inverted amplifier which consists of a PMOST PM14 and an NMOST NM15. The input terminal 105 and output terminal 106 of this inverted amplifier are connected by a switch composed of a PMOST PM16 and an NMOST M16. For instance, when the switch (NM12, PM13) connected to the input terminal 103 is rendered conductive in response to a low level of $\phi$ (a high level of $\overline{\phi}$), the switch consisting of an NMOST NM16 and a PMOST PM17 is also rendered conductive, so that the potential becomes equal between the terminals 105 and 106. Then, the switch (NM10, PM11) connected to the input terminal 102 is rendered conductive in response to a high level of $\phi$ (a low level of $\overline{\phi}$), and the other two switches are rendered nonconductive. In this instance, the potential at the terminal 104 changes by a difference between the voltage at the terminal 102 and the voltage at the terminal 103. This change is transmitted to the inverted amplifier and this change is amplified by several tens of times to produce an output at the terminal 106. Therefore, the voltage difference between the terminal 102 and the terminal 103 is compared. This circuit may appear to be simple. The capacitor C1, however, has a size which is several times greater than the size of the inverted amplifier. Further, the gain of the inverted amplifier is several tens of times at the greatest, which is not sufficient to drive the logic circuit when the input voltage difference becomes smaller than 1 mV. Therefore, the voltage must be considerably amplified in the subsequent latch circuit 107. Moreover, the period for sampling the voltage of terminal 103 is different from the time for sampling the voltage of terminal 102. If the power supply voltage changes between these two periods, the change of power supply voltage is also treated equally to the input voltage of signals. The circuit therefore is easily affected by noise or change in the power supply.

DESCRIPTION OF PREFERRED EMBODIMENTS

A first embodiment of the present invention will be described with reference to FIG. 4.

The circuit according to the invention is comprised of a first flip-flop consisting of NMOST's NM21 and NM22 having data terminals 204 and 205 at the drain electrodes of NMOST's NM21 and NM22; NMOST's NM23 and NM24 connected in parallel with the NMOST's NM21, NM22, respectively; a second flip-flop consisting of PMOST's PM25 and PM26 having data terminals at the drains of PMOST's PM25 and PM26; PMOST's PM27 and PM28 connected in parallel with the PMOST's PM25, PM26 to act as charge means for charging up nodes 206 and 207 when a low pulse is applied to control terminal 208; and NMOST's NM29 and NM30 which are connected between drain electrodes of the NMOST's NM21, NM22 and drain electrodes of the PMOST's PM25, PM26, respectively. Gate electrodes of the PMOST's PM27 and PM28 and gate electrodes of the NMOST's NM29 and NM30 are connected in common to a control terminal 208 to which a control pulse is applied. Voltages to be compared are applied to input terminals 202 and 203 connected to gate electrodes of the NMOST's NM23 and NM24, respectively.

The drain electrodes of the PMOST's PM25 and PM27 are connected in common to an output terminal 206, and the drain electrodes of the other PMOST's PM26 and PM28 are commonly connected to another output terminal 207. Tho source electrodes of all the PMOST's PM25 to PM28 are connected in common to a reference potential via common terminal 201, and the source electrodes of the NMOST's NM21 to NM24 are connected in common to another reference voltage via common terminal 209. In this example, the terminal 201 is connected to a power supply $V_{DD}$ of positive polarity, and the terminal 209 is grounded.

When the power supply voltage $V_{DD}$ is 5 volts, and the NMOST's have a threshold voltage of 0.8 volt, the input voltage should desirably be greater than the threshold voltage of NMOST's NM23 and NM24 by about one volt, so that the circuit can be operated at high speed.

First, input signals having voltage levels higher than the threshold voltage of the input transistors NM23 and NM24 with a small difference from each either are applied to the input terminals 202 and 203. Therefore, the input transistors NM23 and NM24 are conductive, and the potential at the nodes 204 are 205 are at a low level. On the other hand, during this first period, a pulse at the control terminal 208 is at a low (ground) level. Therefore, the NMOST's NM29 and NM30 are nonconductive and the PMOST's PM27 and PM28 are conductive, and accordingly the potentials at the terminals 206 and 207 are equal to the voltage $V_{DD}$ at the power supply terminal 201. Then, a positive pulse ($V_{DD}$ level) is applied to the control terminal 208 during a second period, and the NMOST's NM29 and NM30 are rendered conductive while the PMOST's PM27 and PM28 are rendered nonconductive. Accordingly, an electric current flows into the first flip-flop consisting of NMOST's NM21 and NM22 via NMOST's NM29 and NM30. In this instance, if the potential of the input signal at the input terminal 202 is higher than the potential of the other input signal at the terminal 203, an electric current flows more into the NMOST NM23 than into the NMOST NM24. No current flows into the NMOST's NM21 and NM22 unless the potential at the node 205 or 204 exceeds the threshold voltage thereof. At an early time after the NMOST's NM29 and NM30 are rendered conductive, the nodes 204 and 205 are electrically charged similarly. However, since an amount of discharge from the node 204 via NM23 is larger than that from the node 205 via NM24, the potential at the node 205 exceeds the threshold voltage, first. Then, the NMOST NM21 starts to discharge the charges at the node 204, and the potential at the node 204 does not rise. Accordingly, the potential at the node 205 continues to rise. Hence, the current flows more through the NMOST NM29 than through the NMOST NM30. Accordingly, the potential at the terminal 206 becomes lower than the potential at the terminal 207. Therefore, the second flip-flop consisting of PMOST's PM25 and PM26 operates, and the potential at the output terminal 206 rapidly falls. Thus, the transistors NM23 and NM24 will act as data means to determine the potentials at the nodes 204 and 205 in accordance with the input signals at the input terminals 202 and 203, and the output voltage levels at the output terminals 206 and 207 are consequently determined depending upon the input signals at the input terminals 202 and 203. Since the circuit consists of two flip-flops, the time period necessary for the output voltage levels to be determined is as short as 20 ns or less even when use is made of MOS transistors having a channel length of about 6 microns. Further, since the transistors are arrayed completely symmetrically from the input side to the output side, the cause of developing an offset voltage can be eliminated, that was a defect in the conventional circuits. The power supply noise is equally added to the two input voltages to cancel each other. Therefore, there is no probability that the circuit is erroneously operated by noise. Moreover, the gain is infinitely great since a positive feedback is applied by the flip-flops, and a sufficiently large logic amplitude, i.e., sufficiently large output voltage is obtained even when the difference between the input voltages becomes smaller than 1 mV.

To return the control circuit to the initial condition, the pulse at the control terminal 208 is returned to the low level. The NMOST's NM29 and NM30 are then rendered nonconductive, and the PMOST's PM27 and PM28 are rendered conductive. The electric charges at the nodes 204 and 205 are then quickly discharged through NMOST's NM23 and NM24, while the nodes 206 and 207 are quickly charged through PMOST's PM27 and PM28 to resume the power supply voltage $V_{DD}$. With the circuit setup of the present invention, the reset time can be easily reduced to shorter than 10 ns.

In the initial condition, the circuit of the present invention does not consume electric power. Even during the operation of comparison, the circuit of the present invention consumes very small amounts of electric power, which is one-tenth or less the power consumption by the conventional circuits.

In the aforementioned case, the input voltage at the input terminals 202 and 203 should desirably be higher than the threshold voltage of NMOST's NM23 and NM24 by about one volt, so that the circuit exhibits optimum performance. An ordinary differential amplifier circuit will suffice for obtaining the above-mentioned condition over a wide input range. An example is illustrated in FIG. 5, in which a conventional differential amplifier circuit A is added to the circuit B of the present invention.

A second embodiment of the present invention will be described below with reference to FIG. 6.

The circuit according to the second embodiment further comprises resistors R1 and R2 having an equal resistance, which are inserted between the ground terminal 209 and the sources of NMOST's NM23 and NM24, respectively. The other structure is the same as the first embodiment of FIG. 4.

First, a pulse of the low level is applied to the control terminal 208 and the input signals at the input terminals 202 and 203 are at the high level. Under this condition, the NMOST's NM23 and NM24 and the PMOST's PM27 and PM28 are rendered conductive, and the NMOST's NM29 and NM30 are rendered nonconductive. Therefore, the power supply voltage $V_{DD}$ at the power supply terminal 201 appears at the output terminals 206 and 207. The potential at the nodes 204 and 205 are at the ground level. When a positive pulse is applied to the terminal 208, the NMOST's NM29 and NM30 are rendered conductive and the PMOST's PM27 and PM28 are rendered nonconductive, resulting in an electric current flowing into the drains of NMOST's NM21 and NM22 via NMOST's NM29 and NM30. In this case, if the potential at the terminal 202 is higher than the potential at the terminal 203, the electric current flows more into the NMOST NM23 than into the NMOST NM24. No current flows into the NMOST's NM21 and NM22 unless the potential at the node 205 or 204 exceeds the threshold voltage thereof. At an early time after the NMOST's NM29 and NM30 are rendered conductive, the nodes 204 and 205 are electrically charged similarly. However, the node 204 is discharged more quickly than the node 205 and the potential at the node 205 exceeds the threshold voltage of the NMOST NM21, first. Then, the NMOST NM21 becomes an additional discharge path, and the potential at the node 204 does not rise but rather falls. Namely, the first flip-flop consisting of NMOST's NM21 and NM22 operates.

The discharging current flows more through the node 204 than through the node 205. Therefore, the electric current flows more through the PMOST PM25 than through the PMOST PM26. Then, the flip-flop consisting of PMOST's PM25 and PM26 operates, whereby the potential drop at the output terminal 206 is accelerated, so that its voltage rapidly drops to the ground potential. Accordingly, the voltage drop by the PMOST PM26 becomes very small and causes the PMOST PM25 to become nonconductive; i.e., no current flows into the PMOST PM25. Thus, the output voltage condition is determined depending on the input voltage difference.

When input voltages at the input terminals 202 and 203 to be compared are too high, the resistors R1 and R2 prevent excess current from flowing into the NMOST's NM23 and NM24. That is, the resistors R1 and R2 work to widen the range of input voltages. These resistors R1 and R2 may be replaced by transistors with their gates being served with a predetermined bias voltage. The resistance of the resistors R1 and R2 is so determined that the NMOST's NM23 and NM24 operate in a pentode region when the voltages are being compared.

I claim:

1. A voltage comparator circuit comprising a first flip-flop circuit having first and second data terminals and a first common terminal, means for connecting said first common terminal to a first voltage terminal, a second flip-flop circuit having third and fourth data terminals and a second common terminal, means for connecting said second common terminal to a second voltage terminal, charge means for operatively charging said third and fourth data terminals with a predetermined potential, first data means for determining a potential at said first data terminal in response to a first input voltage, second data means for determining a potential at said second data terminal in response to a second input voltage, first switch means for operatively connecting said first data terminal to said third data terminal, second switch means for operatively connecting said second data terminal to said fourth data terminal, first control means for enabling said charge means during a first period, and second control means for enabling said first and second switch means during a second period following said first period, and means for deriving an output signal from at least one of said third and fourth data terminals.

2. The circuit according to claim 1, in which said first flip-flop circuit includes a first field effect transistor coupled between said first common terminal and said first data terminal and having a gate connected to said second data terminal and a second field effect transistor coupled between said first common terminal and said second data terminal and having a gate connected to said first data terminal, both of said first and second transistors being of a first conductivity type.

3. The circuit according to claim 2, in which said second flip-flop circuit includes a third field effect transistor coupled between said second common terminal and said third data terminal and having a gate coupled to said fourth data terminal, and a fourth field effect transistor coupled between said second common terminal and said fourth data terminal and having a gate coupled to said third data terminal, said third and fourth transistors being of a second conductivity type.

4. The circuit according to claim 1, in which said charge means includes a fifth field effect transistor coupled between said second common terminal and said third data terminal, and a sixth field effect transistor coupled between said second common terminal and said fourth data terminal, said fifth and sixth transistors being of a second conductivity type.

5. The circuit according to claim 4, in which said first data means includes a seventh field effect transistor coupled between said first common terminal and said first data terminal, and said second data means includes an eighth field effect transistor coupled between said first common terminal and said second data terminal, said seventh and eighth transistors being of a first conductivity type.

6. The circuit according to claim 4, in which said first switch means includes a ninth field effect transistor coupled between said first data terminal and said third data terminal, and said second switch means includes a tenth field effect transistor coupled between said second data terminal and said fourth data terminal, said ninth and tenth transistors being of a first conductivity type.

7. The circuit according to claim 4, in which said first data means further includes first resistor means connected in series with said seventh transistor and said second data means further includes second resistor means connected in series with said eighth transistor.

8. A voltage comparator circuit comprising first and second field effect transistors of a first conductivity type each having first and second electrodes and a control electrode, with the control electrodes of said first and second field effect transistors being coupled to the first electrodes of said second and first field effect transistors, respectively, at respective first and second nodes and with their second electrodes being connected to a first voltage terminal, a third field effect transistor of said first conductivity and coupled in parallel with said first transistor, a fourth field effect transistor of said first conductivity type and coupled in parallel with said second transistor, fifth and sixth field effect transistors of a second conductivity type each having first and second electrodes and a control electrode, with the control electrodes of said fifth and sixth field effect transistors being coupled to the first electrodes of said sixth and fifth field effect transistors, respectively, at respective third and fourth nodes and with their second electrodes being connected to a second voltage terminal, a seventh field effect transistor of said second conductivity type coupled in parallel with said fifth transistor, an eighth field effect transistor of said second conductivity type coupled in parallel with said sixth transistor, a ninth field effect transistor of said first conductivity type coupled between said first node and said third node, a tenth field effect transistor of said first conductivity type coupled between said second node and said fourth node, a first input terminal coupled to the control electrode of said third transistor, a second input terminal coupled to the control electrode of said fourth transistor, a control terminal coupled to the control electrodes of said seventh, eighth, ninth and tenth transistors, and means for deriving an output signal from at least one of said third and fourth nodes.

9. The circuit according to claim 8, further comprising a first impedance means coupled in series with said third transistor and a second impedance means coupled in series with said fourth transistor.

10. The circuit according to claim 8, further comprising a differential amplifier having a pair of outputs which are supplied to said first and second input terminals.

11. A voltage comparator circuit comprising a first cross-couple circuit including a first field effect transistor coupled between a first voltage terminal and a first node and having a gate coupled to a second node, and a second field effect transistor coupled between said first voltage terminal and said second node and having a gate coupled to said first node, said first and second transistors being of a first conductivity type; a second cross-couple circuit including a third field effect transistor coupled between a second voltage terminal and a third node and having a gate coupled to a fourth node, and a fourth field effect transistor coupled between said second voltage terminal and said fourth node and having a gate coupled to said third node, said third and fourth transistors being of a second conductivity type; means for charging said third and fourth nodes to a predetermined potential during a first period; first switch means coupled between said first and third nodes; second switch means coupled between said second and fourth nodes; means for making said first and second switch means conducting during a second period following said first period; and means for determining a state of said first cross-couple circuit in response to a pair of differential voltages.

* * * * *